United States Patent [19]

Tsui et al.

[11] Patent Number: 5,291,125
[45] Date of Patent: Mar. 1, 1994

[54] INSTANTANEOUS FREQUENCY MEASUREMENT (IFM) RECEIVER WITH TWO SIGNAL CAPABILITY

[75] Inventors: James B. Y. Tsui, Dayton; James N. Hedge, Medway, both of Ohio

[73] Assignee: The United States of America as represented by the Secretary of the Air Force, Washington, D.C.

[21] Appl. No.: 947,682

[22] Filed: Sep. 14, 1992

[51] Int. Cl.$^5$ .................. G06F 15/31; G01R 23/00
[52] U.S. Cl. .................. 324/76.22; 324/76.24; 324/76.21; 324/76.31; 342/195; 342/196; 342/162; 342/16; 364/484; 364/485
[58] Field of Search .................. 455/133, 134, 140; 324/76.31, 76.29, 76.22, 76.24, 76.21, 76.19, 77.11; 342/195, 196, 162; 364/484, 485

[56] References Cited

U.S. PATENT DOCUMENTS

| | | | |
|---|---|---|---|
| 3,215,934 | 11/1965 | Sallen | 324/76.31 |
| 4,459,542 | 7/1984 | Terrier | 324/76.31 |
| 4,556,982 | 12/1985 | Dunn | 324/76.31 |
| 4,633,116 | 12/1986 | Tsui . | |
| 4,757,253 | 7/1088 | Weber et al. . | |
| 4,791,360 | 12/1988 | Gagnon et al. . | |
| 4,963,816 | 10/1990 | Tsui et al. . | |
| 4,977,365 | 12/1990 | Tsui et al. . | |
| 4,992,747 | 2/1991 | Myers . | |
| 5,075,619 | 12/1991 | Said | 324/76.31 |
| 5,119,432 | 6/1992 | Hirsch | 324/76.31 |

FOREIGN PATENT DOCUMENTS

0117605 9/1979 Japan .................. 455/132

*Primary Examiner*—Kenneth A. Wieder
*Assistant Examiner*—Jose M. Solis
*Attorney, Agent, or Firm*—Bernard E. Franz; Thomas L. Kundert

[57] ABSTRACT

An IFM (Instantaneous Frequency Measurement) receiver is disclosed that can process two simultaneous signals for electronic warfare application. Three IFM receivers are employed (cooperating in the 2 to 4 GHZ range) and have three filters in front of them. Filter 1 is a 2-4 GHz band pass receiver in front of the first receiver. In front of the second receiver is a low pass filter with a band edge at 2 GHz. In front of the third receiver is a high pass filter with the band edge at 4 GHz. In filters 2 and 3, the skirts of the filters are used rather than their pass bands. Details on the signal conditions, calculations for the frequencies, and the equations are disclosed.

2 Claims, 3 Drawing Sheets

INSTANTANEOUS FREQUENCY MEASUREMENT (IFM) RECEIVER WITH TWO SIGNAL CAPABILITY

RIGHTS OF THE GOVERNMENT

The invention described herein may be manufactured and used by or for the Government of the United States for all governmental purposes without the payment of any royalty.

BACKGROUND OF THE INVENTION

The present invention relates generally to an Instantaneous Frequency Measurement (IFM) receiver system with two signal capability.

An IFM receiver can have very wide bandwidth, and generate fine frequency information on a short pulsed signal. It also has small size and light weight. Although it has all the desired properties required for Electronic Warfare (EW) applications, it has one major deficiency: that is, the IFM receiver can not process simultaneous signals. Theoretically, an IFM receiver can be designed to work with simultaneous signals such as discussed in U.S. Pat. No. 4,977,365 by James B.Y. Tsui and William S. McCormick for an "Instantaneous Frequency Measurement (IFM) Receiver to Measure Frequency and Angle of Arrival (AOA of Multiple Signals", issued Dec. 11, 1990. The approach used in that patent has the following characteristics: To actually design an IFM receiver with that method, one needs many mathematical operations using number theory and the Chinese remainder theorem which might be difficult to implement in hardware. The delay lines selected to achieve the multiple signal IFM receiver are different from those used in conventional IFM receivers. One of the most important factors is the predicted dynamic range of the IFM receiver. When two signals are within 6 dB, the receiver will detect both signals. When the two signals are separated by more than 6 dB the receiver will receive the stronger one and miss the weak one. Therefore, the maximum dynamic range for two signals will be approximately 6 dB which is inadequate for most EW applications.

| The following United States patents are of interest. | |
|---|---|
| 4,633,516 | Tsui |
| 4,757,253 | Weber et al |
| 4,791,360 | Gagnon et al |
| 4,963,816 | Tsui et al |
| 4,992,747 | Myers |
| 4,977,365 | Tsui et al |

The Tsui patent 4,633,516 discloses an instantaneous frequency measurement receiver having a digital format for supply to the utilization circuits 26 and is an improvement over conventional (prior art) receivers shown in FIG. 1. The circuit includes a 90° hybrid and A/D converters. The input signal from the amplifier-limiter combination 12 passes through hybrid 34. The two A/D converters 36, 38 digitize the outputs at time $t_1$ and then at time $(t_1 + r)$. If the A/D converters are too slow to sample at a time r apart, then four A/D converters 56-59 can be used. In that case, converters 56, 58 will sample at $t_1$ and the other two 57, 59 will sample at time $(t_1 + r)$. The equations are disclosed.

Weber et al disclose a circuit arrangement for frequency analysis of received signals which lie in a wide overall frequency band. Circuit details of the filter bank, frequency modulators, transmission channels, and the transmission paths are disclosed.

Gannon et al disclose a method for simultaneous signal frequency measurement, wherein simultaneous signals of similar amplitude are received and successively applied to a plurality of either frequency or time dependent signal modifying circuits, via switching circuitry. Respective ones of the received signals are separated with respect to frequency in one of both of amplitude and time from one another via the signal modifying circuits, which can be low pass and high pass filters, or positive and negative dispersive delay lines. The frequency information relating to the weaker signals is not lost. The signals need not have comparable amplitudes or coincident leading edges. Quantizer circuits 39A, 39B and 39C are provided for digitizing and encoding the outputs of the respective differential amplifier and detector circuits 37A, 37B and 37C and generating digital signals representative of the input signal frequency in response thereto. Several alternative designs are disclosed.

Tsui et al patent 4,963,816 discloses an instantaneous frequency measurement receiver with only two delay lines. The algorithm for achieving frequency resolution is based on the Chinese remainder theorem.

Myers discloses the multiple reuse of an FM band wherein a signal receiving system is utilized for receiving messages from each of several unequal amplitude FM carriers occupying the same portion of the frequency band.

SUMMARY OF THE INVENTION

An objective of the invention is to provide an IFM receiver that can process two simultaneous signals.

The invention relates to an IFM (Instantaneous Frequency Measurement) receiver that can process two simultaneous signals for electronic warfare application. Three IFM receivers are employed (cooperating in a given frequency range) and have three filters in front of them. Filter 1 is a band pass filter for the given frequency range in front of the first receiver. In front of the second receiver is a low pass filter with a band edge at the lower end of the given frequency range. In front of the third receiver is a high pass filter with the band edge at the upper end of the given frequency range. In filters 2 and 3, the skirts of the filters are used rather than their pass bands. Details on the signal conditions, calculations for the frequencies, and the equations are found in the Detailed Description.

DETAILED DESCRIPTION

Figure 1:
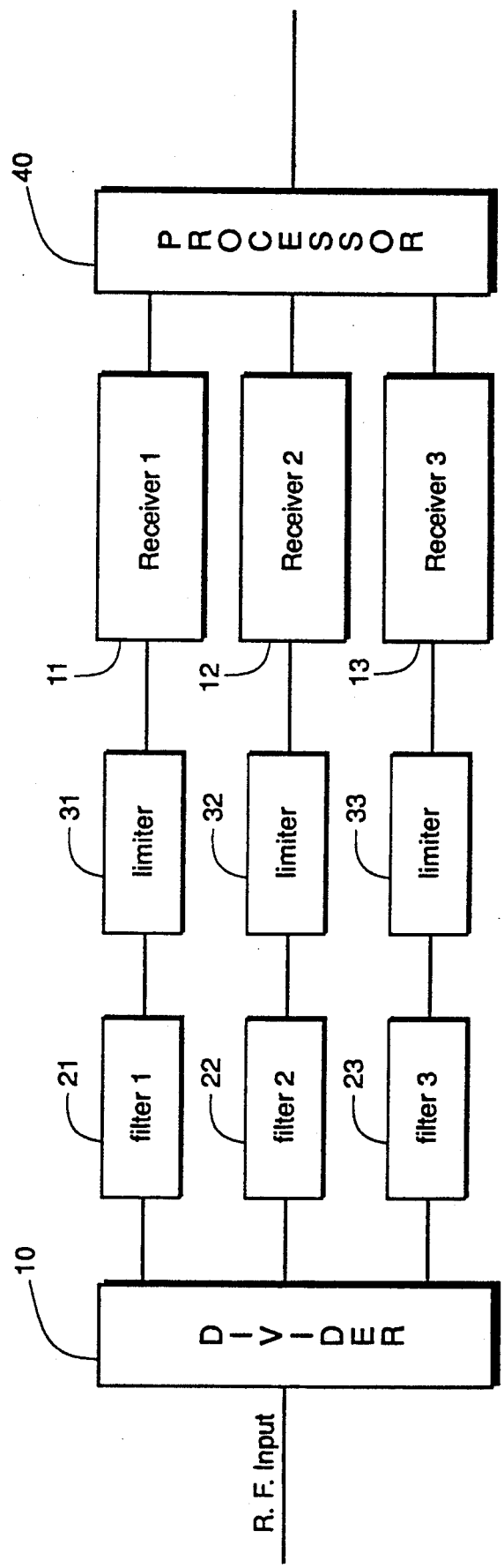
FIG. 1 is a block diagram showing an Instantaneous Frequency Measurement (IFM) receiver system with two signal capability.

The new approach can be considered as a system approach using three IFM receivers. Each of the receivers has the capability to detect the presence of simultaneous signals.

A. Receiver System Configuration: In order to simplify the discussion, assume that the receiver system operates in the range of 2 to 4 GHZ. As shown in FIG.

1, there are three IFM receivers 11, 12 and 13. All three receivers operate in the 2 to 4 GHz range and there are three filters in front of them. In front of the first receiver 11, a first filter 21 is a 2–4 GHz band pass filter. In front of the second receiver 12, a second filter 22 is a 2–4 GHz low pass filter with its band edge at 2 GHz. In front of the third receiver 13, a third filter 23 is a 2–4 GHz high pass filter with its band edge at 4 GHz. A limiter 31 is connected between the first filter 21 and the first receiver 11, a limiter 32 is connected between the second filter 22 and the second receiver 12, and a limiter 33 is connected between the third filter 23 and the third receiver 13. An RF input signal is supplied to the three filters via a signal divider network 10. The outputs of the three receivers are supplied to a signal processor 40.

Figure 2A:
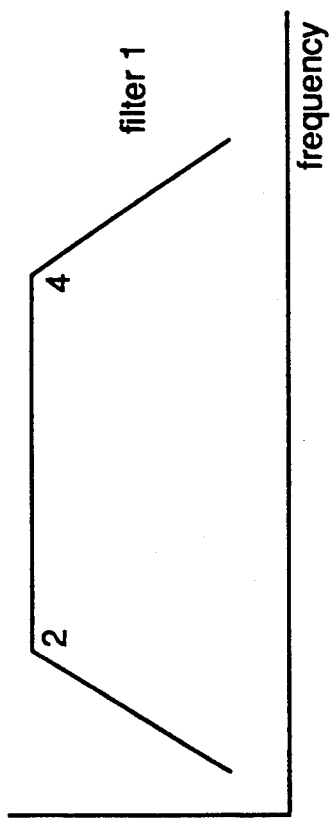
FIGS. 2a, 2b and 2c are graphs of the pass characteristics of the three filters shown in FIG. 1.
Figure 2B:
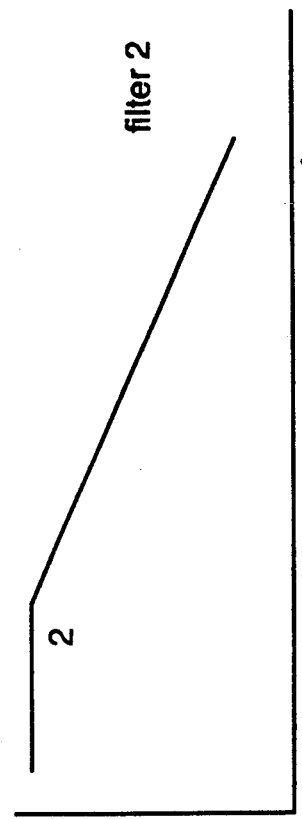
Figure 2C:
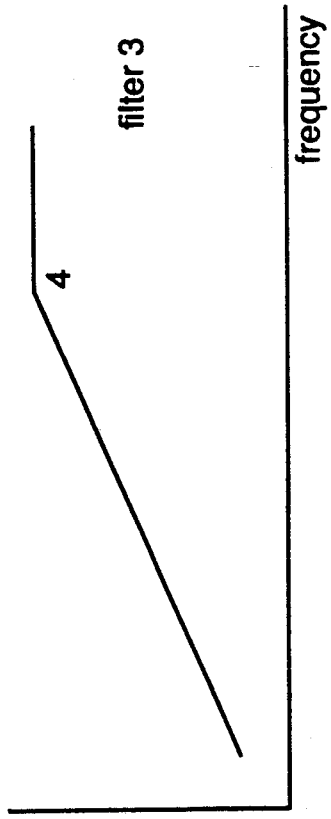

The frequency responses of the three filters are shown in FIGS. 2a, 2b and 2c respectively. In the second and third filters, the skirts of the filters are used rather than the pass bands. Assume that two signals S1 and S2 have amplitudes A1 and A2. When the signal amplitude A1 is stronger than the signal amplitude A2 by more that 6 dB, the receiver will read the frequency of signal S1.

B. Signal Conditions: When two simultaneous signals arrive at the receiver system, one of the following conditions will occur:

1) assume that the two signals S1 and S2 have amplitudes A1 and A2 and frequencies f1 and f2 and also assume that the signal amplitude A1≈A2 and that the frequency f1<f2. Under this condition, the first receiver 11 may generate erroneous frequency information, the two signals have approximately the same amplitudes. Due to the slope of the second filter 22, the second receiver 12 should report the frequency f1. Due to the slope of the third filter 23, the third receiver 13 should read frequency f2, because A1<A2. All three receivers have simultaneous signal detection circuitry which will be discussed later. The simultaneous signal detection circuit would confirm whether the second or third receiver provides the correct frequency. If one of the frequencies is known, the frequency of the other one can be calculated easily. The calculation will be discussed later. Both the second and third receivers can provide the correct frequency. Under this condition the second receiver will read the frequency f1, and the third receiver will read the frequency f2.

2) If the two signal amplitudes are A1>A2, and f1<f2, then the first receiver should read frequency f1. Due to the slope of the second filter, the second receiver should also read the frequency f1. Under this condition, two of the three receivers read the same frequency. Depending on the relative frequency and amplitude separation, the third receiver can either provide erroneous data or read the frequency f2. The simultaneous signal detection circuit should confirm whether the third receiver generates erroneous data. If an erroneous frequency is reported by the third receiver, the frequency f2 can be calculated.

3) This signal condition is quite similar to the above one mentioned in 2). If the two signal amplitudes are A1<A2, and f1<f2, then the first receiver should read frequency f2. Due to the slope of the third filter, the third receiver should also read the frequency f2. Under this condition, two of the three receivers read the same frequency. The second frequency f2 can either be read by the second receiver or calculated from the data of the second receiver.

C. Simultaneous Signal Detection Circuits (SSDC): In a conventional IFM receiver, the delays are commonly related by a ratio of 2. For example, the delay lines can be $\tau$, $2\tau$, $4\tau$, $8\tau$, $16\tau$, $32\tau$, and $64\tau$ where $\tau \approx 0.39$ns in an IFM receiver with inputs from 2 to 4 GHz. The SSDC may use any of two pairs of delay lines with ratio of 2. The outputs from the correlator with $\tau$ delay can be written as $$U_1 = A_1^2\cos(2\pi f_1\tau) + A_2^2\cos(2\pi f_2\tau) \quad (1)$$
$$U_2 = A_1^2\sin(2\pi f_1\tau) + A_2^2\sin(2\pi f_2\tau)$$
$$V_1 = A_1^2\cos(4\pi f_1\tau) + A_2^2\cos(4\pi f_2\tau)$$
$$V_2 = A_1^2\sin(4\pi f_1\tau) + A_2^2\sin(4\pi f_2\tau)$$

where $A_1$, $A_2$, $f_1$ and $f_2$ are the amplitudes and input frequencies of signals S1 and S2. The above equations can be combined as $$U = U_1 + jU_2 = A_1^2 e^{j2\pi f_1\tau} + A_2^2 e^{j2\pi f_2\tau} \quad (2)$$
$$V = V_1 + jV_2 = A_1^2 e^{j4\pi f_1\tau} + A_2^2 e^{j4\pi f_2\tau}$$

In the above equation, in general $U \neq V$. When there is only one signal that is $A_2=0$, then $U=V$. By checking the amplitude of U and V, one can determine whether there are simultaneous signals.

D. Solving for the Second Frequency: From the measurements of U and V one can solve for the second frequency, provided one of the input frequencies is known. From the arrangement of FIG. 1 one of the input frequencies can be measured correctly. The SSDC can be used to confirm the measurement. Suppose that the frequency $f_2$ is known. Equation 1 can be rewritten as $$U_1 - A_2^2\cos(2\pi f_2\tau) = A_1^2\cos(2\pi f_1\tau) \quad (3)$$
$$U_2 - A_2^2\sin(2\pi f_2\tau) = A_1^2\sin(2\pi f_1\tau)$$
$$V_1 - A_1^2\cos(4\pi f_2\tau) = A_1^2\cos(4\pi f_1\tau)$$
$$V_2 - A_1^2\sin(4\pi f_2\tau) = A_1^2\sin(4\pi f_1\tau)$$

Using the relation $$\sin^2\theta + \cos^2\theta = 1 \quad (4)$$

Equation 3 can be written as $$A_1^4 = (U_1 - A_2^2\cos\theta_2)^2 + (U_2 - A_2^2\sin\theta_2)^2 \quad (5)$$
$$= [V_1 - A_2^4\cos(2\theta_2)]^2 + [(V_2 - A_2^2\sin(2\theta_2)]^2$$

where
$$\theta_1 = 2\pi f_1\tau \text{ and } \theta_2 = 2\pi f_2\tau.$$

After simplification, the amplitude of $A_2$ can be obtained as $$A_2^4 = \frac{U_1^2 + U_2^2 - V_1^2 - V_2^2}{2[U_1\cos\theta_2 + U_2\sin\theta_2 - V_1\cos(2\theta_2) - V_2\sin(2\theta_2)]} \quad (6)$$

Once $A_2$ is obtained, the frequency of $f_1$ can be obtained from the following equations:

$$A_1^2\cos(2\pi f_1\tau) = U_1 - A_2^2\cos(2\pi f_2\tau)$$
$$A_1^2\sin(2\pi f_1\tau) = U_2 - A_2^2\sin(2\pi f_2\tau)$$

Since $A_2$ and $f_2$ are known, the value of $f_1$ can be solved for as in a conventional IFM receiver.

The processor shown in FIG. 1 will be used to perform the necessary mathematical calculations and generate the correct frequency information. The dynamic range of this approach depends on the frequency separation between the two input signals and the skirts of the low and high pass filters 22 and 23. If the individual IFM receiver 11, 12 or 13 used in the design has a dynamic range of 60 dB, the overall two signal dynamic range of the receiver system, theoretically, can reach 60 dB under best signal condition. Therefore, the two signals dynamic range should not be limited to about 6 dB as in a single IFM receiver.

Figure 3:
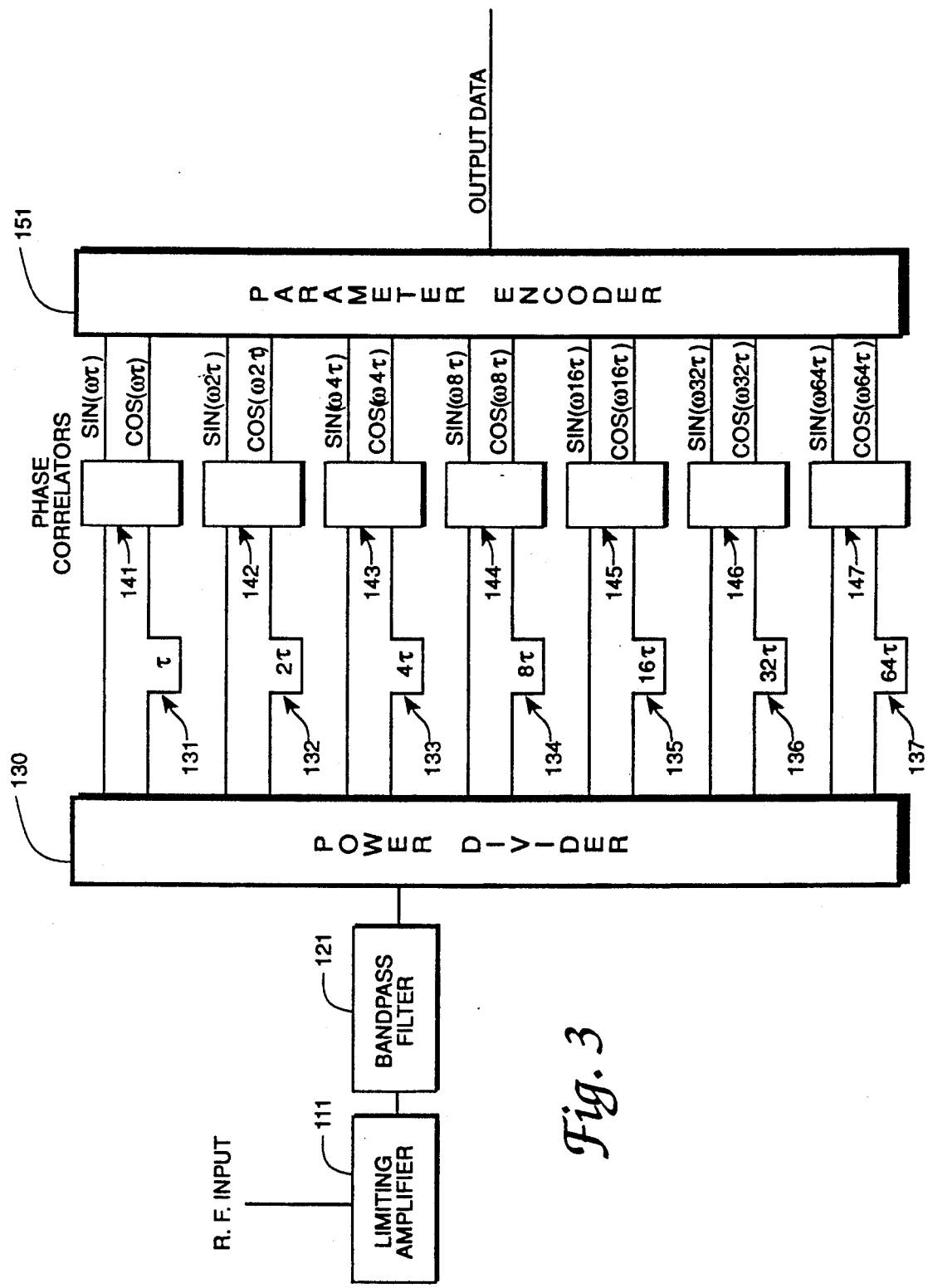
FIG. 3 is a functional block diagram showing a conventional IFM receiver.

FIG. 3 is a functional block diagram of a conventional IFM receiver as used in FIG. 1. The RF input is applied to a limiting amplifier 111, which is used to remove amplitude variations from the signal. The output passes through a bandpass filter 121 which attenuates any signals that are not within the passband of interest. The signal is then divided by a power divider 130 and applied to delay lines 131, 132, 133, 134, 135, 136 and 137, which provides delays of $\tau$, $2\tau$, $4\tau$, $8\tau$, $16\tau$, $32\tau$, and $64\tau$ respectively. The outputs of the delay lines are passed respectively to phase correlators 141, 142, 143, 144, 145, 146, and 147. Each of the correlators also has an undelayed input from the power divider 130. The phase correlators produce outputs that are the sine and cosine of the product of the input frequency and the delay time. The sine and cosine outputs from the correlators are then used by a parameter encoder 151 to report the applied frequency at the output data.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. An instantaneous frequency measurement (IFM) system comprising first, second and third IFM receivers, cooperating in a given frequency range from a given lower frequency to a given upper frequency, each IFM receiver having the capability to detect simultaneous signals, a first filter coupled to an input of the first IFM receiver, a second filter coupled to an input of the second IFM receiver, a third filter coupled to an input of the third IFM receiver, the first filter being a bandpass filter for the given frequency range, the second filter being a low pass filter with a band edge at said given lower frequency and having a skirt including said given frequency range with a high response at the given lower frequency and a low response at the given upper frequency, the third filter being a high pass filter with a band edge at the given upper frequency and having a skirt including said given frequency range with a low response at the given lower frequency and a high response at the given upper frequency, whereby the pass band of the first filter is used, and said skirts of the second and third filters are used, input means coupling an RF input line to inputs of the first, second and third filters, processor means coupled to outputs of the first, second and third IFM receivers;

wherein each of said first, second and third IFM receivers includes correlator means and simultaneous signal detection means which will produce an error signal in response to there being erroneous data due to the presence of simultaneous signals;

wherein in response to simultaneous signals S1 and S2 having amplitudes $A_1$ and $A_2$ respectively and frequencies $f_1$ and $f_2$ respectively at said RF input line, due to the sloped of the second and third filters, one of said signals will have a greater amplitude than the other at the input of at least one of the IFM receivers to correctly report the frequency thereof, and each of the IFM receivers will either report a correct frequency or generate said error signal, depending on the relative amplitude and frequency values;

wherein the processor means includes means responsive to output signals from the correlator means and simultaneous signal detection means of one of the IFM receivers, and the correctly reported one of the frequencies for determining the value of the other frequency;

whereby the IFM system is able to determine and report the frequencies of both the first and second signals within a dynamic range substantially greater than a dynamic-range simultaneous-signals reporting capability of the first, second and third IFM receivers individually.

2. An instantaneous frequency measurement (IFM) system according to claim 1, wherein the correlator means and simultaneous signal detection means of each IFM receiver includes delay line means providing a delay tau, and the outputs from the correlator can be written as $$U_1 = A_1^2\cos(2\pi f_1\tau) + A_2^2\cos(2\pi f_2\tau)$$
$$U_2 = A_1^2\sin(2\pi f_1\tau) + A_2^2\sin(2\pi f_2\tau)$$
$$V_1 = A_1^2\cos(4\pi f_1\tau) + A_2^2\cos(4\pi f_2\tau)$$
$$V_2 = A_1^2\sin(4\pi f_1\tau) + A_2^2\sin(4\pi f_2\tau)$$

and combined as $$U = U_1 + jU_2 = A_1^2 e^{j2\pi f_1\tau} + A_2^2 e^{j2\pi f_2\tau}$$
$$V = V_1 + jV_2 = A_1^2 e^{j4\pi f_1\tau} + A_2^2 e^{j4\pi f_2\tau}$$

where simultaneous signals are detected by determining that U and V are not equal;

wherein, designating the known frequency as $f_2$, the processor means includes means to solve for the amplitudes $A_1$ and $A_2$ of the signals as $$A_1^4 = (U_1 - A_2^2\cos\theta_2)^2 + (U_2 - A_2^2\sin\theta_2)^2$$
$$= [V_1 - A_2^4\cos(2\theta_2)]^2 + [(V_2 - A_2^2\sin(2\theta_2)]^2$$

where
$\theta_1 = 2\pi f_1\tau$ and $\theta_2 = 2\pi f_2\tau$ $$A_2^4 = \frac{U_1^2 + U_2^2 - V_1^2 - V_2^2}{2[U_1\cos\theta_2 + U_2\sin\theta_2 - V_1\cos(2\theta_2) - V_2\sin(2\theta_2)]}$$

and then solve for the frequency $f_1$ using the equations $$A_1^2\cos(2\pi f_1\tau) = U_1 - A_2^2\cos(2\pi f_2\tau)$$
$$A_1^2\sin(2\pi f_1\tau) = U_2 - A_2^2\sin(2\pi f_2\tau).$$

* * * * *